United States Patent
Anderson

(10) Patent No.: US 6,268,993 B1
(45) Date of Patent: Jul. 31, 2001

(54) ELECTROSTATIC DISCHARGE PROTECTION CLAMP FOR HIGH-VOLTAGE POWER SUPPLY OR I/O WITH NOMINAL-VOLTAGE REFERENCE

(75) Inventor: Warren R. Anderson, Westborough, MA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/349,269

(22) Filed: Jul. 7, 1999

(51) Int. Cl.[7] ........................................ H02H 3/22
(52) U.S. Cl. ...................... 361/111; 361/91.1; 361/118
(58) Field of Search ............................ 361/56, 111, 118, 361/91.1; 257/368, 395

(56) References Cited

U.S. PATENT DOCUMENTS

| 5,400,202 | * | 3/1995 | Metz et al. ........................... 361/56 |
| 5,932,918 | * | 8/1999 | Krakauer ........................... 257/368 |
| 5,959,820 | * | 9/1999 | Ker et al. ........................... 361/111 |
| 6,091,594 | * | 7/2000 | Williamson et al. .............. 361/111 |
| 6,097,071 | * | 8/2000 | Krakauer ........................... 257/395 |

OTHER PUBLICATIONS

W. R. Anderson, et al., "ESD Protection for Mixed–Voltage I/O Using NMOS Transistors Stacked in a Cascode Configuration," *EOS/ESD Symposium*, pp. 54–62 (Sep., 1998).
Timothy J. Maloney, et al., "Protection of High Voltage Power and Programming Pins," *EOS/ESD Symposium*, pp. 246–254 (Sep., 1997).

* cited by examiner

*Primary Examiner*—Josie Ballato
*Assistant Examiner*—Sharon Polk
(74) *Attorney, Agent, or Firm*—Hamilton, Brook, Smith & Reynolds, P.C.

(57) ABSTRACT

An electrostatic discharge (ESD) protection technique protects a semiconductor device against electrostatic discharge events. The technique uses an ESD protection circuit that includes a two cascode-connected clamps between the protected pad and a reference voltage conductor and an level-shifting inverter amplifier for driving the clamps. A control signal used to control the amplifiers is derived from a nominal-voltage pad, but the voltage used to activate the transistor clamps is derived from the protected pad to achieve the greatest voltage drive on the cascoded clamps during ESD.

17 Claims, 3 Drawing Sheets

ELECTROSTATIC DISCHARGE PROTECTION CLAMP FOR HIGH-VOLTAGE POWER SUPPLY OR I/O WITH NOMINAL-VOLTAGE REFERENCE

BACKGROUND OF THE INVENTION

A typical integrated circuit (IC) includes an IC package and a semiconductor device, which is physically and electrically connected within the IC package. The semiconductor device typically includes electrostatic discharge (ESD) protection devices that protect the semiconductor device against ESD events that would otherwise cause damage. Generally, the ESD protection devices are located within the semiconductor device in close proximity to semiconductor device pads, which electrically connect to pins of the IC package.

One conventional ESD protection device provides an ESD clamp (or shunt) between the semiconductor pad to be protected and a reference conductor (i.e., a ground conductor). If power is disconnected (e.g., when the semiconductor device is being handled prior to its installation within an IC package, or when an assembled IC is being handled prior to its installation on a circuit board), the ESD protection device shunts or clamps any positive charge on the pad that is above a particular threshold to the reference conductor. If the power is on (e.g., when the assembled IC is installed on a circuit board and is operational), the ESD protection device is deactivated and an incoming signal on the pad is permitted to pass through to other semiconductor device circuitry, i.e., internal circuits of device. An example of such an ESD protection device is described in U.S. application Ser. No. 08/979,376, entitled "Cross-Referenced Electrostatic Discharge Protection Systems and Methods for Power Supplies," filed Nov. 26, 1997, the entire teachings of which are incorporated herein by this reference.

Due to improvements in semiconductor technology, manufacturers can now make transistors smaller thereby reducing semiconductor size and power consumption. The decrease in transistor size has been accompanied by a decrease in transistor voltage tolerance, which is the voltage that can be applied safely across any two terminals of each transistor of the semiconductor device without causing thin oxide damage in the context of MOS-type devices, for example. This maximum tolerable voltage for the transistors is commonly referred to as the rated or process technology voltage. For example, older semiconductor devices were built using a 5V process technology where each transistor could tolerate an operating voltage of 5 Volts (V) across any two terminals without sustaining thin oxide damage. More recently, semiconductor devices have been built using a 3.3V process technology. In such devices, the voltage across any two terminals of each transistor must be less than 3.3V in order to avoid causing thin oxide damage. Presently, manufacturers are implementing 2.5V and 1.5V process technology, and such improvements in semiconductor technology are expected to continue.

Occasionally, manufacturers combine IC's having different semiconductor technologies on the same circuit board or in the same system. For example, a manufacturer may mix some IC's having semiconductor devices built using a 5V process technology with other IC's having semiconductor devices built using a 3.3V process technology in order to obtain some of the benefits of using 3.3V process IC's (e.g., smaller packaging, lower power consumption, greater speed, lower cost). For this reason, an IC containing a semiconductor device using a 3.3V process technology must often be designed to interface with IC's containing semiconductor devices built using a 5V process technology. Specifically, the 3.3V IC must drive and receive signals at the logic levels expected by the 5V IC's in the system. To accomplish this, the 3.3V IC often requires a 5V power supply to power the 3.3V IC's I/O stages. Therefore, the 3.3V IC contains a mixture of 3.3V and 5V circuits.

Providing ESD protection in a mixed voltage IC tends to complicate the design of the ESD clamp and its control circuit. For example, one known semiconductor device includes a cantilevered ESD clamp and an RC-timed control circuit, which is interconnected between the power supply pad and the ESD clamp, to control deactivation of the ESD clamp. When power is off, the RC-timed circuit maintains ESD clamp in a conductive state for a time period related to the circuit's time constant. This allows the shunting of a short ESD event from the pad to a reference conductor. In contrast, when power is on, the RC-timed circuit operates as a voltage divider to divide a 5 V power supply signal down to a 3.6 V signal, which is used to disable the ESD clamp. Without the reduction in voltage from 5 V to 3.6 V, one or more components of the ESD clamp would be very susceptible to thin oxide damage. An example of such a circuit (hereinafter referred to as the "cantilevered circuit") is described in an article entitled "Protection of High Voltage Power and Programming Pins," by Maloney et al., EOS/ESD Symposium 97-246, (1997).

SUMMARY OF THE INVENTION

While having certain advantages relative to its prior art, the cantilevered circuit does suffer from certain performance problems. In particular, the cantilevered circuit is not well-suited for situations where it is desirable to disable ESD protection using a signal that is independent of the signal received on the ESD protected pad. For example, in the above-described cantilevered circuit, the 3.6 V power supply signal that disables the ESD clamp is derived from the 5 V power supply signal received on the ESD protected pad. The 3.6 V power supply signal is not independent of the 5 V power supply signal. Additionally, the RC-timed deactivation feature of the cantilevered circuit may result in inadequate ESD protection against prolonged ESD events, which are on the order of the time constant of the circuit. Furthermore, when the RC-timed circuit operates as a voltage divider during normal operation, the RC-timed circuit generates a leakage current that increases IC power consumption.

The present invention is directed to a technique for protecting a semiconductor device against ESD events that uses a control voltage that is independent of the pad being protected. The ESD stage provides a conducting path between the pad and a reference conductor. In particular, the technique involves providing protection for a high-voltage pad of a semiconductor device. The pad is high-voltage in the sense that it is designed to receive a voltage, during operation, that is greater than a rated or process voltage for the device. A control signal that is used to signal ESD events is derived from an independent pad, which is intended to receive a nominal voltage, or voltage level that is near or below the process voltage.

In general, according to one aspect, the invention features an electrostatic discharge protection circuit for a protected, high-voltage pad of a semiconductor device to protect its internal circuits from electrostatic discharge. The protected high-voltage pad receives voltages during the operation of the internal circuits that are greater than a rated voltage of the semiconductor device. The protection circuit comprises a clamp stage, comprising at least two cascode-connected transistor clamps between the protected high-voltage pad and a reference conductor. The clamp stage sinks electrostatic charge from the protected high-voltage pad to the reference conductor and away from the internal circuits. A control stage activates the clamp stage to couple electrostatic charge from the protected high-voltage pad and deactivates the clamp stage when the internal circuits are operational by reference to a control signal, which is derived from an independent reference pad. The control stage comprises a level shifting subcircuit that activates the transistor clamps with a voltage derived from the protected pad.

In specific embodiments, the control stage comprises an inverter circuit that is controlled by the control signal to activate and deactivate the transistor clamps. The reference pad is designed to receive voltages during operation that are at or below the rated voltage. Preferably, the control stage comprises a level shifting inverter that is controlled by the control signal to activate and deactivate the transistor clamps. In one implementation, the inverter is bi-stable when activated during electrostatic discharge events. Capacitive coupling, however, is used between the reference pad and the reference conductor to ensure that the transistor clamps are activated with the voltage derived from the protected pad.

In general, according to another aspect, the invention features an electrostatic discharge protection method for a protected, high-voltage pad of a semiconductor device to protect its internal circuits from electrostatic discharge. This method comprises activating at least two cascode-connected transistor clamps to couple electrostatic charge away from the protected high-voltage pad to a reference conductor with a voltage derived from the protected pad and deactivating the transistor clamps when the internal circuits are operational by reference to a reference pad.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the drawings, like reference characters refer to the same parts throughout the different views. The drawings are not necessarily to scale, emphasis instead being placed upon illustrating the principles of the invention. Of the drawings.

DETAILED DESCRIPTION OF PREFERRED EMBODIMENTS

Figure 1:
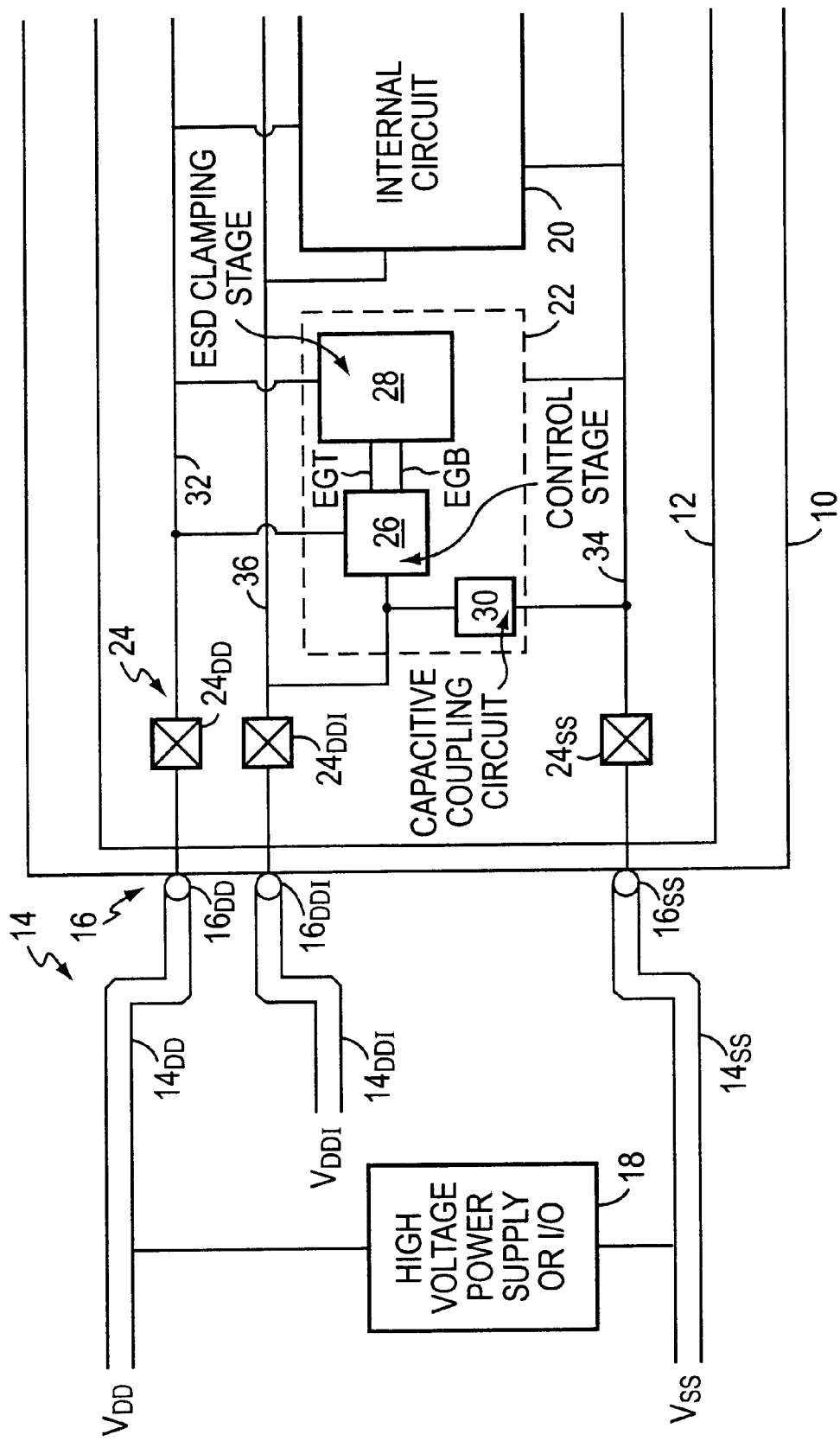
FIG. 1 is a block diagram of an integrated circuit having a semiconductor device that uses an electrostatic discharge (ESD) protection technique according to the present invention.

FIG. 1 shows a portion of a circuit board having an integrated circuit (IC) 10 that includes a semiconductor device 12. During operation, the semiconductor device 12 of the integrated circuit 10 receives voltages on its pads that are greater than the process voltage of its transistors and provides a conducting path that is activated and deactivated based on a control voltage, which is independent of a pad voltage on the pad.

The IC 10 connects with another circuit 18 through circuit board conductors $14_{DD}, 14_{DDI}, 14_{SS}$ (collectively conductors 14) and IC pins $16_{DD}, 16_{DDI}, 16_{SS}$ (collectively pins 16). By way of example, the circuit 18 is a power supply that provides a power supply signal $V_{DD}$ on conductor $14_{DD}$, and a reference or ground signal $V_{SS}$ on conductor $V_{SS}$. Additionally, the conductor $14_{DDI}$ and pin $16_{DDI}$ carry a control signal. By way of example, the control signal is an internal power supply signal that drives internal, typically core logic circuits of the IC 10. In the anticipated implementation, the $V_{DDI}$ power supply signal is equal to or less than the process voltage of the semiconductor device 12 to thereby allow the IC 10 to yield the benefit of low voltage circuitry. The VDD signal is a high voltage, i.e., can be higher than the process voltage either continually as is a power signal or on logic transitions as in an information bearing signal.

The circuit board conductors $14_{DD}, 14_{DDI}, 14_{SS}$ electrically connect to semiconductor pads $24_{DD}, 24_{DDI}, 24_{SS}$ (collectively pads 24) disposed on a surface of the semiconductor device 12. Within the semiconductor device 12, pad $24_{DD}$ connects to a power supply conductor 32, pad $24_{SS}$ connects to a reference conductor 34, and pad $24_{DDI}$ connects to a control conductor 36, which also carries the $V_{DDI}$ power signal to internal logic.

The semiconductor device 12 further includes an internal circuit 20 (e.g. an I/O driver or logic gates) and an ESD protection circuit 22. The internal circuit 20 and the ESD protection circuit 22 connect to the power supply conductor 32, the reference conductor 34 and the control conductor 36. In the example, the internal circuit 20 uses the VDD signal to generate output signals to other devices (i.e., electrical signals that vary between zero and VDD).

The ESD protection circuit 22 includes a level shifting inverter control stage 26, an ESD clamping stage 28, and a capacitive coupling circuit 30. The control stage 26 connects to the power supply conductor 32, the control conductor 36, reference conductor 34, and internal nodes EGT and EGB. The ESD clamping stage 28 connects to the power supply conductor 32, the reference conductor 34, and nodes EGT, EGB. The capacitive coupling circuit 30 is interconnected between control conductor 36 and the reference conductor 34.

The ESD protection circuit 22 protects the semiconductor device 12 against ESD events that occur on the pad $24_{DD}$. In particular, the control stage 26 provides, in response to the control voltage VDDI, deactivating voltages on nodes EGT and EGB when the control voltage VDDI is non-zero and in a steady state such as during normal operation. The voltages on EGT and EGB, however, are tied to the voltage on the power supply conductor 32 when the control voltage VDDI is zero and a positive ESD event appears on power supply conductor 32.

The ESD clamping stage 28 provides a conducting path between the pad $24_{DD}$ and the reference conductor 34. The conducting path is activated and deactivated based on the control voltage VDDI. When the control voltage is low relative to the voltage on the reference conductor 34 (e.g., before the IC 10 has been installed on the circuit board), the ESD clamping circuit 28 provides the conducting path for ESD events. Accordingly, the ESD protection circuit 22 protects semiconductor circuitry such as the internal circuit 20 against positive ESD events on the pad $24_{DD}$ by shunting positive ESD charge from the pad $24_{DD}$ to the reference conductor 34. When the control voltage VDDI is high relative to the voltage on the reference conductor (e.g., after the IC 10 has been installed on the circuit board and when the IC 10 is powered up), the ESD clamping stage 28 is deactivated. Accordingly, the power supply signal VDD is allowed to power the IC 20 (e.g., the internal circuit 20 and/or I/O circuits and stage of the semiconductor device 12).

Figure 2:
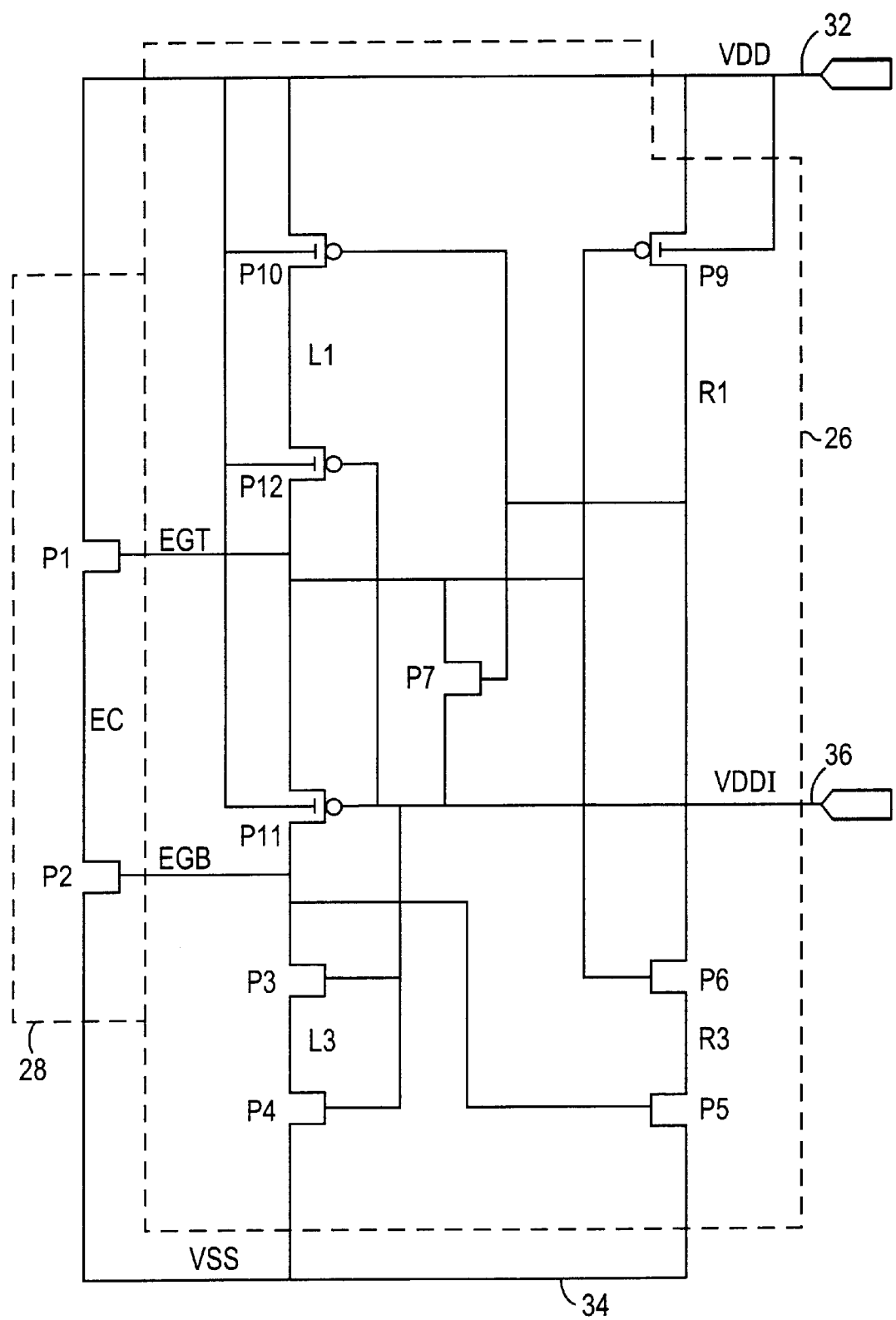
FIG. 2 is a circuit diagram of circuitry within the inventive semiconductor device of FIG. 1, and specifically the ESD protection circuit according to the present invention.

FIG. 2 shows details of the ESD protection circuit 22 of FIG. 1.

NMOS stack of devices P1,P2 provide the current sink for ESD protection during ESD events. These NMOS devices P1,P2 form the clamping stage 28.

The cascoded NMOS stack ensures that reliability rules are not violated. The expected voltage on VDD is divided between two devices to the ground VSS potential.

Because VDDI is used as the control signal to identify ESD events and is a lower voltage reference, a simple inverter will not adequately control the gates of NMOS devices P1,P2. The control stage 26 is implemented as a level-shifting inverter network. Such a network will achieve the desired biasing of the gate nodes EGT and EGB, both during normal operation and electrostatic discharge events. Specifically, during normal operation, node EGT is preferably tied to VDDI and node EGB is tied to the ground or VSS of the reference voltage conductor 34. In contrast, to maximize channel conduction during ESD events, both of nodes EGT and EGB are preferably raised to the voltage on the protected pad or the VDD voltage of conductor 32. Specifically, transistor clamps P1,P2 are activated with a voltage that is derived from the protected pad.

Generally, to achieve the desired operation during normal operation and ESD events, two cross-coupled inverter pairs are used. The first inverter comprises transistors P6 and P9. The second inverter of the pair comprises P7 and P10.

Specifically, during normal operation, the circuit operates as follows. The VDD is at 2.5 volts and VDDI is at 1.5 volts in one implementation. As a result, transistors P3 and P4 are on, this pulls node EGB to the voltage of reference conductor VSS. Node EGT, however, can not drop far below the VDDI voltage. If it did, the source of transistor P11 would go below the gate, thus turning P11 off. Therefore, transistor P6 is on. Additionally, P5 is off because node EGB is low. Therefore, R1 is pulled all the way to VDD through P9, whose gate, EGT, is near VDDI. The gate of transistor P10 is high and thus P10 is off. Node EGT and L1 is thus free to discharge. However, transistor P7 is on and keeps EGT at VDDI.

The operation during ESD is actually bi-stable. The voltage of VDDI is low during ESD. Transistors P3 and P4 are thus off. When conductor VDD goes high, it is assumed that node R1 is low; as a result, transistors P10, P11, and P12 are on. This allows nodes EGT and EGB to go high. As a result, transistor P9 is off and P6 is on. P5 is on. Therefore, node R1 is pulled low.

In an alternative regime, node R1 could go high and be stable with EGT and EGB low. This is avoided by adding capacitance 30 in FIG. 1 to avoid this undesired regime.

During normal operation, no more than 1.5 V is placed across any terminal of any transistor in the circuit, except for bulk connections, which is acceptable. With EGT at VDD and EGB at ground, transistors P1 and P2 have no voltage that exceeds the 1.5 V on VDDI. Transistors P3 and P4 are stacked and thus, no excessive voltage drop occurs. The gate of transistor P6 is at VDD. The gate of transistor P5 is at VSS and thus, off.

Figure 3:
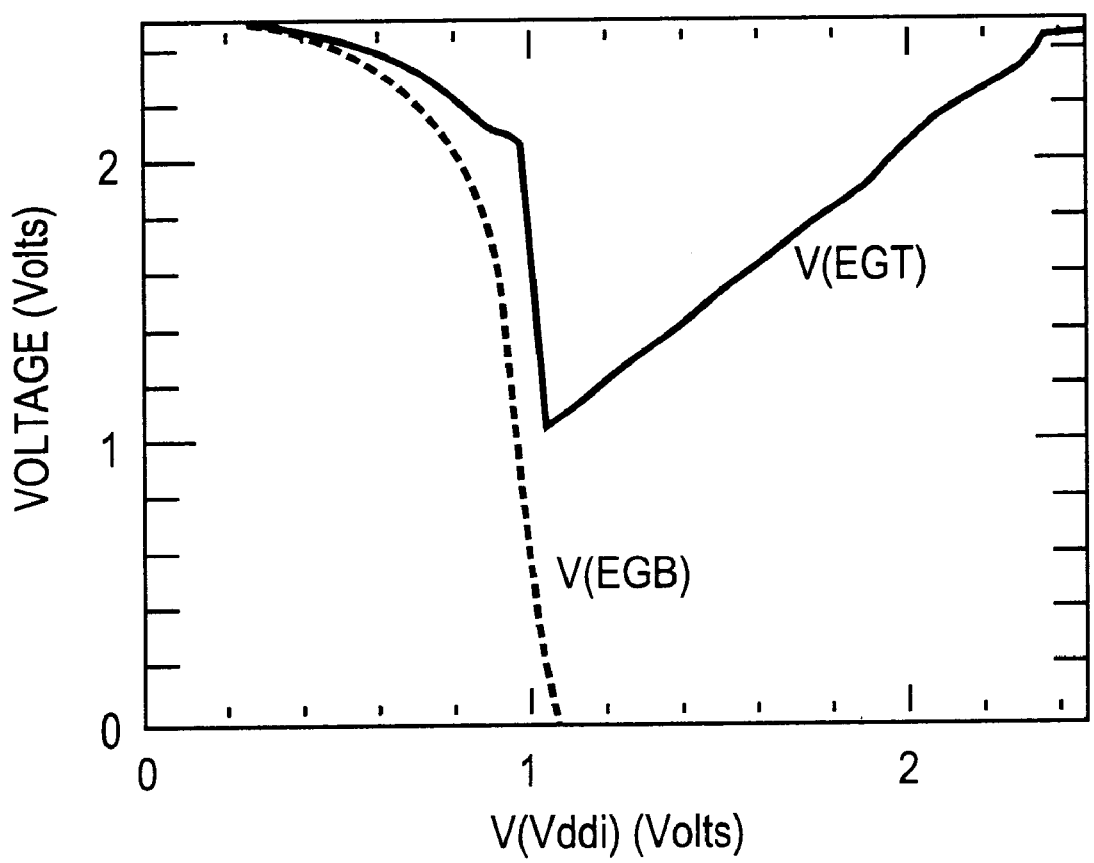
FIG. 3 is a chart of voltages within the circuitry of FIG. 2 showing operation.

FIG. 3 is a simulation of the transfer curves for the circuit of FIG. 2. With a voltage of 2.5 V on VDD, the voltage of node VDDI is swept from ground to 2.5 V. (Note: the normal voltage for VDDI is 1.5V. It was swept above this voltage to 2.5V solely for academic interest). The simulation results show that both EGT and EGB are high when VDDI is at ground, which corresponds to the ESD Condition. When VDDI raises above a critical level, node EGB goes to ground and EGT follows VDDI as desired during normal operation.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An electrostatic discharge protection circuit for a protected, high-voltage pad of a semiconductor device to protect its internal circuits from electrostatic discharge, the protected high-voltage pad being designed to receive voltages during the operation of the internal circuits that are greater than a rated voltage of the semiconductor device, the protection circuit comprising:

a clamp stage, comprising at least two cascode-connected transistor clamps between the protected high-voltage pad and a reference conductor, that sinks electrostatic charge from the protected high-voltage pad to the reference conductor and away from the internal circuits; and a control stage that activates the clamp stage to couple electrostatic charge from the protected high-voltage pad and deactivates the clamp stage when the internal circuits are operational by reference to a control signal, which is derived from a reference pad, the reference pad powered to the less than or equal to the process rated voltage during normal operation, the control stage performing level shifting during normal operation such that the voltage across each transistor clamp does not exceed the process rated voltage and during electrostatic discharge events so that the transistor clamps are activated with a voltage derived from the protected pad.

2. The electrostatic discharge protection circuit of claim 1, wherein the control stage comprises an inverter circuit that is controlled by the control signal to activate and deactivate the transistor clamps.

3. The electrostatic discharge protection circuit of claim 1, wherein the reference pad is designed to receive voltages during operation that are at or below the rated voltage.

4. The electrostatic discharge protection circuit of claim 3, wherein the control stage comprises a level shifting inverter that is controlled by the control signal to activate and deactivate the transistor clamps.

5. The electrostatic discharge protection circuit of claim 1, wherein the control stage comprises a level shifting inverter that is controlled by the control signal to activate and deactivate the transistor clamps.

6. The electrostatic discharge protection circuit of claim 1, wherein the level shifting inverter includes capacitance to avoid undesired bi-stable operation.

7. The electrostatic discharge protection circuit of claim 6, wherein capacitive coupling between the reference pad and the reference conductor ensures that the transistor clamps are activated with the voltage derived from the protected pad.

8. An electrostatic discharge protection circuit for a protected, high-voltage pad of a semiconductor device to protect its internal circuits from electrostatic discharge, the protected high-voltage pad being designed to receive voltages during the operation of the internal circuits that are greater than a rated voltage of the semiconductor device, the protection circuit comprising:

a clamp stage that sinks electrostatic charge from the protected high-voltage pad to the reference conductor and away from the internal circuits; and a control stage that activates the clamp stage to couple electrostatic charge from the protected high-voltage pad and deactivates the clamp stage when the internal circuits are operational by reference to a control signal, which is derived from a reference pad, the reference pad powered to the less than or equal to the process rated voltage during normal operation, the control stage comprising:

a level shifting inverter circuit that is controlled by the control signal to activate the transistor clamps with a voltage derived from the protected pad during electrostatic discharge events and to deactivate the transistor clamps during normal operation such that the voltage across each transistor clamp does not exceed the process rated voltage.

9. An electrostatic discharge protection method for a protected, high-voltage pad of a semiconductor device to protect its internal circuits from electrostatic discharge, the protected high-voltage pad being designed to receive voltages during the operation of the internal circuits that are greater than a rated voltage of the semiconductor device, the protection method comprising:

activating at least two cascode-connected transistor clamps to couple electrostatic charge away from the protected high-voltage pad to a reference conductor with a level shifting inverter using a voltage derived from a reference pad; and deactivating the transistor clamps when the internal circuits are operational by reference to a reference pad such that the voltage across each transistor clamp does not exceed the process rated voltage, the reference pad powered to the less than or equal to the process rated voltage during normal operation.

10. The electrostatic discharge protection method of claim 9, further comprising differentially driving transistor clamps to activate and deactivate the transistor clamps.

11. The electrostatic discharge protection method of claim 9, further comprising providing the reference pad with voltages during operation that are at or below the rated voltage of the semiconductor device.

12. The electrostatic discharge protection method of claim 9, further comprising providing capacitive coupling between the reference pad and the reference conductor to ensure proper operation during electrostatic discharge.

13. An electrostatic discharge protection circuit for a protected, high-voltage pad of a semiconductor device to protect its internal circuits from electrostatic discharge, the protected high-voltage pad being designed to receive voltages during the operation of the internal circuits that are greater than a rated voltage of the semiconductor device, the protection circuit comprising:

means for sinking electrostatic charge from protected high-voltage pad to a reference conductor and away from the internal circuits; and means for activating the sinking means to couple the electrostatic charge from the protected high-voltage pad and for deactivating the sinking means when the internal circuits are operational by reference to a control signal, which is derived from a reference pad, the reference pad powered to the less than or equal to the process rated voltage during normal operation, the sinking means performing level shifting during normal operation such that the voltage across each transistor clamp does not exceed the process rated voltage and during electrostatic discharge events so that the transistor clamps are activated with a voltage derived from the protected pad.

14. A system board comprising an integrated circuit, which includes an electrostatic discharge protection circuit for a protected, high-voltage pad of a semiconductor device to protect its internal circuits from electrostatic discharge, the protected high-voltage pad being designed to receive voltages during the operation of the internal circuits that are greater than a rated voltage of the semiconductor device, the protection circuit comprising:

a clamp stage, comprising at least two cascode-connected transistor clamps between the protected high-voltage pad and a reference conductor, that sinks electrostatic charge from the protected high-voltage pad to the reference conductor and away from the internal circuits; and a control stage that activates the clamp stage to couple electrostatic charge from the protected high-voltage pad and deactivates the clamp stage when the internal circuits are operational by reference to a control signal, which is derived from a reference pad, the reference pad powered to the less than or equal to the process rated voltage during normal operation, the control stage performing level shifting during normal operation such that the voltage across each transistor clamp does not exceed the process rated voltage and during electrostatic discharge events so that the transistor clamps are activated with a voltage derived from the protected pad.

15. An electrostatic discharge protection circuit for a protected, high-voltage pad of a semiconductor device to protect its internal circuits from electrostatic discharge, the protected high-voltage pad being designed to receive voltages during the operation of the internal circuits that are greater than a rated voltage of the semiconductor device, the protection circuit comprising:

a clamp stage, comprising at least two cascode-connected transistor clamps between the protected high-voltage pad and a reference conductor, that sinks electrostatic charge from the protected high-voltage pad to the reference conductor and away from the internal circuits; and a control stage that activates the clamp stage to couple electrostatic charge from the protected high-voltage pad and deactivates the clamp stage when the internal circuits are operational by reference to a control signal, which is derived from a reference pad, the control stage performing level shifting during electrostatic discharge events so that the transistor clamps are activated with a voltage derived from the protected pad;

the level shifting inverter includes capacitance to avoid undesired bi-stable operation.

16. The electrostatic discharge protection circuit of claim 15, wherein capacitive coupling between the reference pad and the reference conductor ensures that the transistor clamps are activated with the voltage derived from the protected pad.

17. An electrostatic discharge protection method for a protected, high-voltage pad of a semiconductor device to protect its internal circuits from electrostatic discharge, the protected high-voltage pad being designed to receive voltages during the operation of the internal circuits that are greater than a rated voltage of the semiconductor device, the protection method comprising:

activating at least two cascode-connected transistor clamps to couple electrostatic charge away from the protected high-voltage pad to a reference conductor with a level shifting inverter using a voltage derived from a reference pad;

deactivating the transistor clamps when the internal circuits are operational by reference to a reference pad; and providing capacitive coupling between the reference pad and the reference conductor to ensure proper operation during electrostatic discharge.

* * * * *